(12) United States Patent
Zheng et al.

(10) Patent No.: US 9,780,524 B1
(45) Date of Patent: Oct. 3, 2017

(54) FAST TUNABLE HYBRID LASER WITH A SILICON-PHOTONIC SWITCH

(71) Applicant: Oracle International Corporation, Redwood Shores, CA (US)

(72) Inventors: Xuezhe Zheng, San Diego, CA (US); Jin Yao, San Diego, CA (US); Ying Luo, San Diego, CA (US); Ashok V. Krishnamoorthy, San Diego, CA (US)

(73) Assignee: ORACLE INTERNATIONAL CORPORATION, Redwood Shores, CA (US)

( * ) Notice: Subject to any disclaimer, the term of this patent is extended or adjusted under 35 U.S.C. 154(b) by 0 days.

(21) Appl. No.: 15/341,675

(22) Filed: Nov. 2, 2016

(51) Int. Cl.
| H01S 5/00 | (2006.01) |
| H01S 5/06 | (2006.01) |
| H01S 5/20 | (2006.01) |
| H01S 5/30 | (2006.01) |
| H01S 5/068 | (2006.01) |
| H01S 5/0683 | (2006.01) |

(Continued)

(52) U.S. Cl.
CPC ........ H01S 5/0608 (2013.01); H01S 5/06821 (2013.01); H01S 5/06837 (2013.01); H01S 5/1028 (2013.01); H01S 5/1092 (2013.01); H01S 5/125 (2013.01); H01S 5/141 (2013.01); H01S 5/20 (2013.01); H01S 5/3013 (2013.01); H01S 5/5027 (2013.01); *H01S 5/0268* (2013.01); *H01S 5/187* (2013.01)

(58) Field of Classification Search
CPC ...... H01S 5/141; H01S 5/1092; H01S 5/0608; H01S 5/0268; H01S 5/187; H01S 5/5027
See application file for complete search history.

(56) References Cited

U.S. PATENT DOCUMENTS

| 2012/0014398 A1* | 1/2012 | Choi ..................... G02B 6/421 372/20 |
| 2013/0016423 A1* | 1/2013 | Zheng .................... H01S 5/142 359/344 |

(Continued)

OTHER PUBLICATIONS

"Electronics Letters", Jul. 20, 2000, vol. 36, No. 15, pp. 1294-1296.
(Continued)

*Primary Examiner* — Kinam Park
(74) *Attorney, Agent, or Firm* — Park, Vaughan, Fleming & Dowler LLP (57) ABSTRACT

A tunable laser includes a reflective silicon optical amplifier (RSOA) with a reflective end and an interface end and an array of narrow-band reflectors, which each have a different center wavelength. It also includes a silicon-photonic optical switch, having an input port and N output ports that are coupled to a different narrow-band reflector in the array of narrow-band reflectors. The tunable laser also includes an optical waveguide coupled between the interface end of the RSOA and the input of the silicon-photonic optical switch. The frequency of this tunable laser can be tuned in discrete increments by selectively coupling the input port of the silicon-photonic optical switch to one of the N output ports, thereby causing the RSOA to form a lasing cavity with a selected narrow-band reflector coupled to the selected output port. The tunable laser also includes a laser output optically coupled to the lasing cavity.

20 Claims, 8 Drawing Sheets

(51) Int. Cl.
  *H01S 5/125* (2006.01)
  *H01S 5/10* (2006.01)
  *H01S 5/14* (2006.01)
  *H01S 5/50* (2006.01)
  *H01S 5/026* (2006.01)
  *H01S 5/187* (2006.01)

(56) References Cited

U.S. PATENT DOCUMENTS

| | | | | |
|---|---|---|---|---|
| 2013/0016744 A1* | 1/2013 | Li | ................ | B82Y 20/00 |
| | | | | 372/20 |
| 2014/0064733 A1* | 3/2014 | Liu | ................ | H04B 10/506 |
| | | | | 398/79 |
| 2017/0017042 A1* | 1/2017 | Menard | ................ | G02B 6/3596 |

OTHER PUBLICATIONS

Xuezhe Zheng, "Three-Dimensional MEMS Photonic Cross-Connect Switch Design and Performance", IEEE Journal of Selected Topics in Quantum Electronics, vol. 9, No. 2, Mar./Apr. 2003.
Tae Joon Seok, "Large-scale Broadband digital silicon photonic switches with vertical adiabatic couplers", Optica, Research Article, vol. 3, No. 1, Jan. 2016.
Jin-Hyoung Lee, "Demonstration of 12.2% wall plug efficiency in uncooled single mode external-cavity tunable Si/III-V hybrid laser", Optics Express, vol. 23, No. 9, May 4, 2015.
Tae Joon Seok, "Highly Scalable Digital Silicon Photonic MEMS Switches", Journal of Lightwave Technology, vol. 34, No. 2, Jan. 15, 2016.

* cited by examiner

FAST TUNABLE HYBRID LASER WITH A SILICON-PHOTONIC SWITCH

GOVERNMENT LICENSE RIGHTS

This invention was made with U.S. government support under Agreement No. HR0011-08-9-0001 awarded by DARPA. The U.S. government has certain rights in the invention.

BACKGROUND

Field

The disclosed embodiments relate to the design of a tunable laser. More specifically, the disclosed embodiments relate to the design of fast tunable silicon hybrid laser that integrates a fast silicon micro-electromechanical systems (MEMS) optical switch with a III-V gain medium and a bank of reflective silicon optical filters.

Related Art

Energy-efficient and cost-effective switches are important building blocks for communication networks in data centers and high-performance computing systems. Existing three-dimensional MEMS-based photonic switches can provide low-cost and energy-efficient traffic switching. However, the millisecond switching times of such switches limit their application to either "elephant" traffic with large packet sizes, or network reconfigurations that are not sensitive to switching time. Recently developed silicon-photonic switches can potentially provide fast optical circuit switching with microsecond, or even nanosecond response times. Moreover, relatively large-scale integrated photonic switches can be realized on silicon using MEMS-actuated matrices. However, existing silicon-photonic MEMS-based optical switches support single polarization only, making them undesirable for practical deployment in optical networks.

An alternative to the optical-switching approach is to use the unique wavelength routing capability of arrayed-waveguide-grating-routers (AWGRs) and carrier wavelength switching at the source node. However, a wavelength-tunable laser source is needed for such source-originated optical switching. A wavelength-tunable hybrid laser source has been implemented using back-end-of-the-line (BOEL) hybrid integration of a III-V gain chip with a silicon-on-insulator (SOI) photonic chip with a tunable wavelength selective reflector. (See Jin-Hyoung Lee, Jock Bovington, Ivan Shubin, Ying Luo, Jin Yao, Shiyun Lin, John E. Cunningham, Kannan Raj, Ashok V. Krishnamoorthy and Xuezhe Zheng, "Demonstration of 12.2% wall plug efficiency in uncooled single mode external-cavity tunable Si/III-V hybrid laser," Optics Express, 23(9) 12079-12088, 2015.) Unfortunately, the wavelength tuning speed of this type of silicon-assisted hybrid laser is limited by the response time of the silicon thermal tuner, which is usually on the order of a few microseconds.

Hence, to achieve the goal of sub-microsecond optical switching, faster tunable lasers are needed.

SUMMARY

The disclosed embodiments provide a tunable laser that includes a reflective silicon optical amplifier (RSOA) having a reflective end and an interface end. It also includes an array of N narrow-band reflectors, wherein each narrow-band reflector in the array has a different center wavelength. It additionally includes a 1×N silicon-photonic optical switch, having an input port and N output ports, wherein each output port is coupled to a different narrow-band reflector in the array of N narrow-band reflectors. The tunable laser also includes an optical waveguide that couples the interface end of the RSOA to the input of the 1×N silicon-photonic optical switch. The frequency of the tunable laser can be tuned in discrete increments by selectively coupling the input port of the 1×N silicon-photonic optical switch to one of the N output ports, thereby causing the RSOA to form a lasing cavity with a selected narrow-band reflector coupled to the selected output port. This lasing cavity has a wavelength that is determined by the center wavelength of the selected narrow-band reflector. The tunable laser also includes a laser output, which is optically coupled to the lasing cavity.

In some embodiments, there exists a predetermined channel spacing between center wavelengths for the N narrow-band reflectors in the array of N narrow-band reflectors.

In some embodiments, the RSOA is located on a III-V gain chip, which is separate from a silicon-on-insulator (SOI) chip that includes the optical waveguide and other components of the tunable laser.

In some embodiments, the III-V gain chip is optically coupled to the optical waveguide on the SOI chip through one of the following: waveguide-to-waveguide edge coupling; surface-normal coupling; or evanescent coupling.

In some embodiments, the optical waveguide feeds through a phase tuner before coupling to the input of the 1×N silicon-photonic optical switch, wherein the phase tuner facilitates adjusting a frequency of the integrated laser.

In some embodiments, the laser output comprises a directional coupler integrated into the optical waveguide.

In some embodiments, each narrow-band reflector in the array of N narrow-band reflectors comprises a distributed Bragg reflector (DBR), wherein each DBR in the array has a different pitch to achieve a different center wavelength.

In some embodiments, each narrow-band reflector in the array of N narrow-band reflectors comprises a ring-resonator-based filter, wherein each ring-resonator-based filter in the array has a different radius to achieve a different center wavelength.

In some embodiments, the array of N narrow-band reflectors is implemented using an arrayed waveguide grating (AWG), wherein a waveguide DBR is coupled to a multiplexed output of the AWG to provide partial reflections to the lasing cavity and also to simultaneously provide the laser output.

In some embodiments, the array of N narrow-band reflectors is implemented using an Echelle grating, wherein a waveguide DBR is coupled to a multiplexed output of the Echelle grating to provide partial reflections to the lasing cavity and also to simultaneously provide the laser output.

DETAILED DESCRIPTION

The following description is presented to enable any person skilled in the art to make and use the present embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present embodiments. Thus, the present embodiments are not limited to the embodiments shown, but are to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium. Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Tunable Laser

Figure 1:
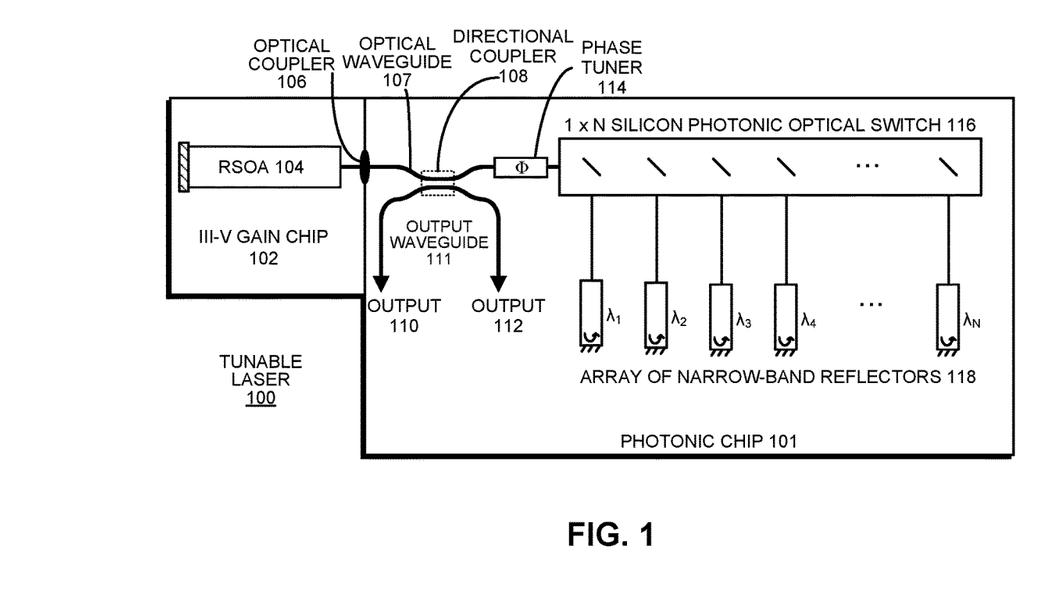
FIG. 1 illustrates a tunable laser implemented using an array of narrow-band reflectors in accordance with the disclosed embodiments.

FIG. 1 illustrates a tunable laser 100 implemented using an array of narrow-band reflectors 118 in accordance with the disclosed embodiments. This tunable laser 100 includes a reflective semiconductor optical amplifier (RSOA) 104, which comprises an optical gain medium with a reflective coating at one end. This optical gain medium may include a III-V semiconductor, such as gallium-arsenide, indium-phosphide, erbium or germanium. In some embodiments, a high reflectivity mirror is integrated into the optical gain medium instead of using the reflective coating. For example, this integrated high reflectivity mirror can include: a strong DBR, a notched mirror, or a metal layer. As illustrated in FIG. 1, RSOA 104 can be located on a III-V gain chip 102, which is separate from a photonic chip 101 that includes other components of the tunable laser. Photonic chip 101 can be implemented using silicon-on-insulator (SOI) technology.

RSOA 104 generates an optical signal, which has an associated carrier or fundamental wavelength $\lambda$ (such as 1.3 or 1.55 µm). This optical signal feeds though an optical coupler 106 into an optical waveguide 107 in photonic chip 101. Optical waveguide 107 feeds the optical signal into an input port of a 1×N silicon-photonic optical switch 116, which has N output ports, wherein each of the N output ports is coupled to a different narrow-band reflector in the array of N narrow-band reflectors 118. This 1×N silicon-photonic switch 116 can be implemented using a micro-electromechanical systems (MEMS)-actuated matrix. (For an example of this type of MEMS-actuated matrix switch, see Tae Joon Seok, Niels Quack, Sanyoon Han, Richard S. Muller, and Ming C. Wu, "Large-scale broadband digital silicon photonic switches with vertical adiabatic couplers," Optica, 3 (1) 64-70 (2016). Also, see Tae Joon Seok, Niels Quack, Sanyoon Han, Richard S. Muller, and Ming C. Wu, "High scalable digital silicon photonic MEMS switches," JLT 34 (2) 365-371 (2016).) This type of MEMS-actuated matrix can be very compact and can also achieve sub-microsecond switching with very small insertion loss. Hence, fast (sub-microsecond) wavelength switching is expected with little impairment to wall-plug-efficiency when it is integrated with an external-cavity III-V/Si hybrid laser.

Figure 2:
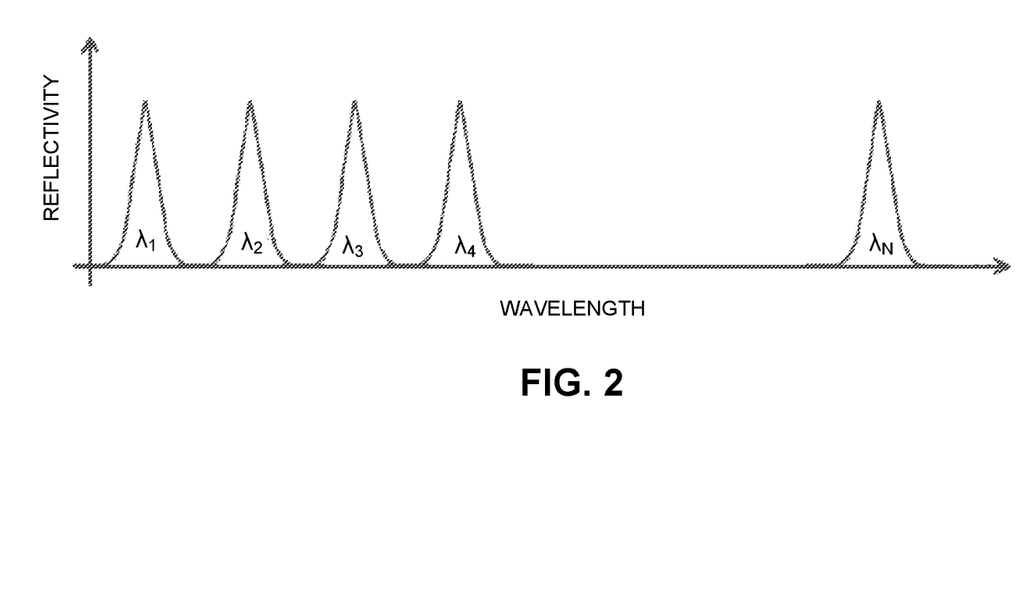
FIG. 2 illustrates the combined spectra of an array of narrow-band reflectors in accordance with the disclosed embodiments.

Moreover, each narrow-band reflector in the array of narrow-band reflectors 118 is designed to provide: a high reflectivity, a narrow bandwidth on the order of ~0.5 nm, and a different center wavelength at a pre-determined channel spacing. For example, the combined spectra of the reflector array is conceptually illustrated in FIG. 2. The filter frequencies can be selected to span the width of the gain medium. In this case, the number of filters in the array is constrained by the width of the gain medium and the inter-channel spacing between the filters.

The frequency of tunable laser 100 can be adjusted in discrete increments by selectively coupling the input port of 1×N silicon-photonic optical switch 116 to one of the N output ports, thereby causing RSOA 104 to form a lasing cavity with a selected narrow-band reflector in the array of narrow-band reflectors 118, which is coupled to the selected output port. This lasing cavity has a wavelength that is determined by the center wavelength of the selected narrow-band reflector.

Optical waveguide 107 feeds through a phase tuner 114 before feeding into the input of 1×N silicon-photonic optical switch 116, wherein phase tuner 114 facilitates fast alignments of the lasing cavity mode with the selected reflector's center wavelength. Note that phase tuner 114 can be adjusted thermally, or alternatively through p-i-n carrier injection (electro-optic effect), which is faster. Although adjusting phase tuner 114 thermally is relatively slow in comparison to p-i-n injection, the range of the phase tuner is fairly small because the cavity modes that need to be adjusted are close to the desired wavelength. Hence, adjusting phase tuner 114 thermally will not take a significant amount of time. Also note that in some embodiments, the filters are aligned with the cavity modes during manufacture as part of the calibration process, which means that phase alignments do not need to take place during switching operations. Also note that in some embodiments the phase tuner can be replaced by a passive thermo-optic coefficient compensator (TOC), which has a thermo-optic index coefficient smaller than silicon and a length selected to make the effective thermo-optic coefficient of the hybrid laser cavity equivalent to the silicon waveguides. By using this type of passive TOC, the individual filters will always be aligned with the cavity mode once they are pre-aligned during manufacture.

As illustrated in FIG. 1, tunable laser 100 also includes an output waveguide 111, which is optically coupled to optical waveguide 107 through a directional coupler 108 that is integrated into optical waveguide 107. This output waveguide 111 has two ends that function as outputs 110 and 112 for tunable laser 100. In some embodiments, the optical output signals that emanate from outputs 110 and 112 comprise optical carrier signals that feed into modulators (not shown). These modulators can modulate the optical output signals with corresponding information signals to generate modulated signals, which are communicated off-chip.

In some embodiments, optical coupler 106 connects an optical signal from RSOA 104 into optical waveguide 107 on photonic chip 101 through one of the following mechanisms: waveguide-to-waveguide edge coupling (such as facet-to-facet optical coupling); vertical or surface-normal coupling (such as a vertical-angled technique using an angled-facet output on RSOA 104, and grating couplers on photonic chip 101), and/or optical proximity communication, which may involve using reflective mirrors and/or evanescent coupling. In an exemplary embodiment, edge-to-edge coupling is facilitated by using a wide optical waveguide within RSOA 104, such as an optical waveguide having a width of 2-3 µm, wherein optical waveguide 107 on photonic chip 101 may have a width of several hundred nanometers. A spot size converter (SSC) is usually used for the small optical waveguide for low loss coupling to the RSOA optical waveguide.

Figure 3:
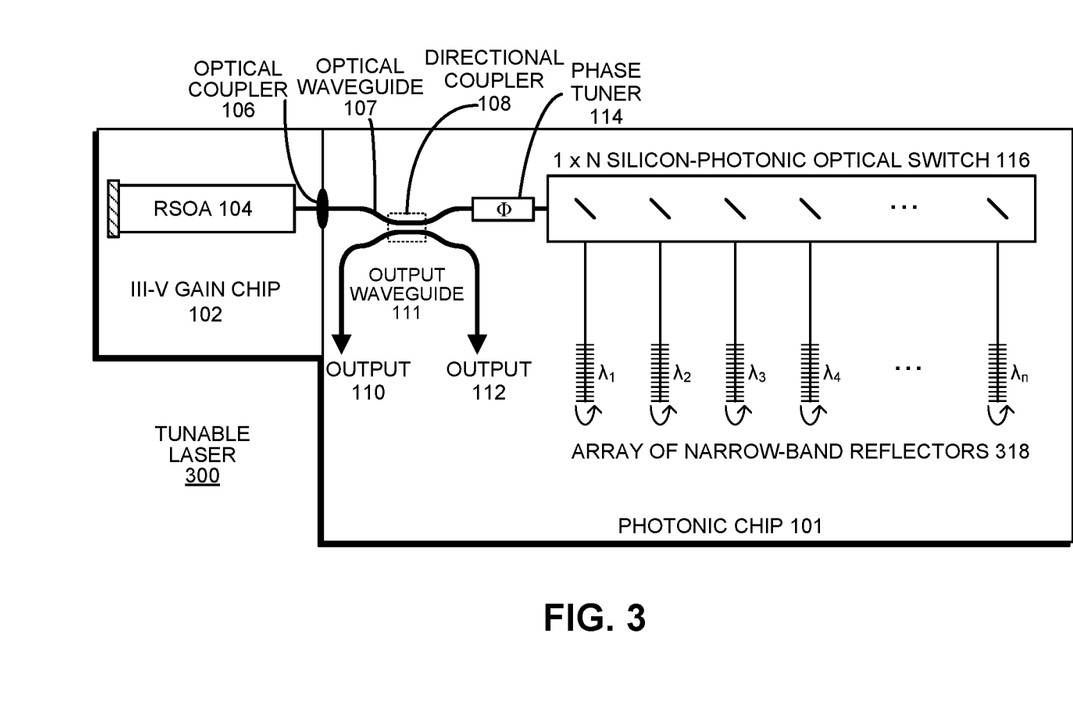
FIG. 3 illustrates a tunable laser implemented using an array of DBRs in accordance with the disclosed embodiments.

In another embodiment of a tunable laser 300, which is illustrated in FIG. 3, each narrow-band reflector in the array of narrow-band reflectors 318 is implemented using a distributed Bragg reflector (DBR) on a silicon waveguide. Note that each of these DBRs can be designed with a slightly different pitch to achieve different center wavelengths at a constant spacing.

Figure 4:
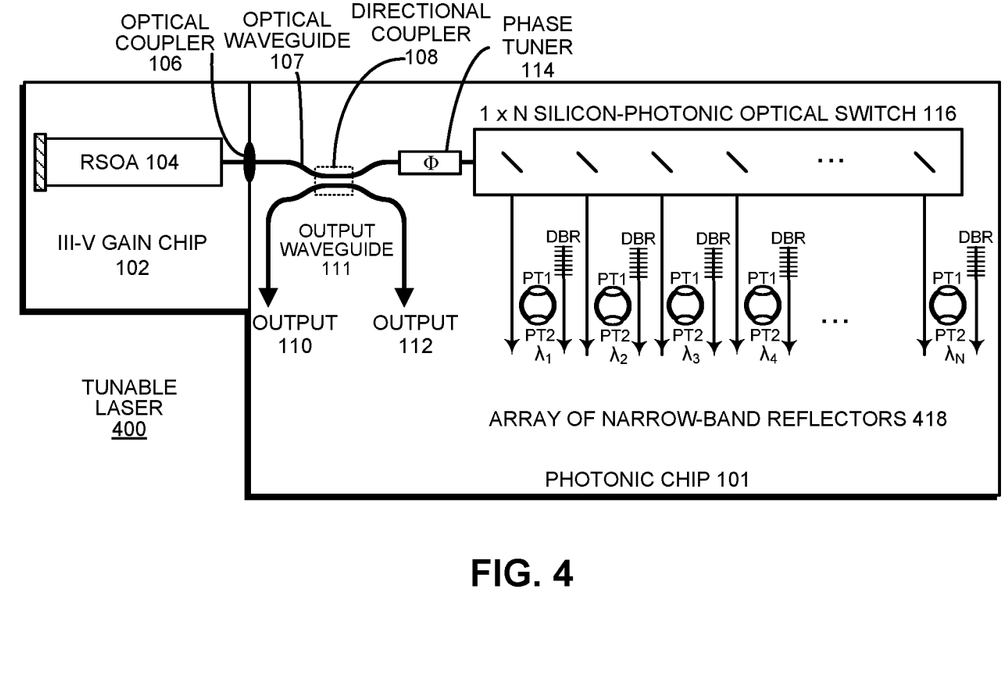
FIG. 4 illustrates a tunable laser implemented using an array of ring-resonator-based filters in accordance with the disclosed embodiments.

In another embodiment of a tunable laser 400, which is illustrated in FIG. 4, each narrow-band reflector in the array of narrow-band reflectors 418 is implemented using a silicon ring resonator and an associated waveguide DBR mirror, wherein each ring resonator is designed with a slightly different radius to achieve different center wavelengths. During operation, light from RSOA 104 is coupled to the selected ring resonator and is optically coupled to the associated waveguide DBR mirror, which reflects the light back through the ring resonator again, and finally back to RSOA 104. Moreover, the waveguide DBR mirror, which is optically coupled to each ring resonator, can be designed with a bandwidth slightly smaller than the free-spectral-range of the ring resonator filter, such that each ring resonator filter only reflects a single narrow wavelength band. Note that each ring resonator can be integrated with phase tuners, PT1 and PT2. One of these phase tuners can be a thermal phase tuner using a metal heater or a silicon heater for coarse channel spacing adjustment. The other phase tuner can be a p-i-n current injection tuner for fast lasing mode locking. In this case, the shared phase tuner is optional.

Figure 5:
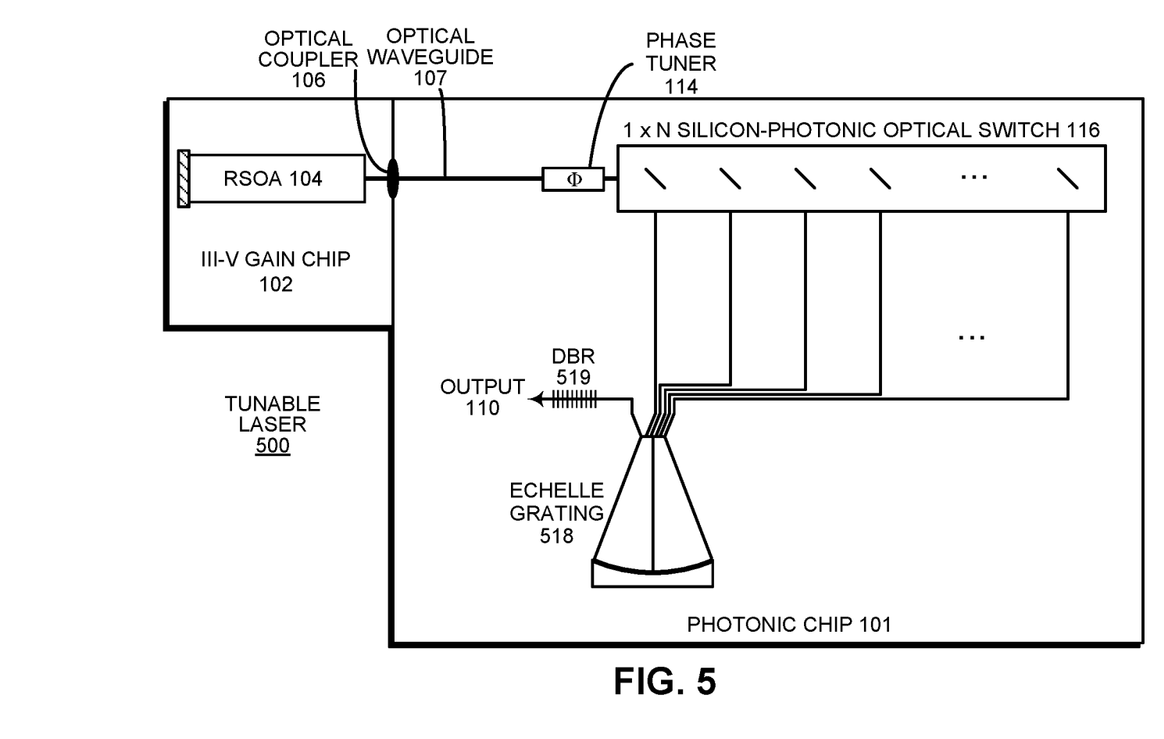
FIG. 5 illustrates a tunable laser implemented using an Echelle grating in accordance with the disclosed embodiments.
Figure 6:
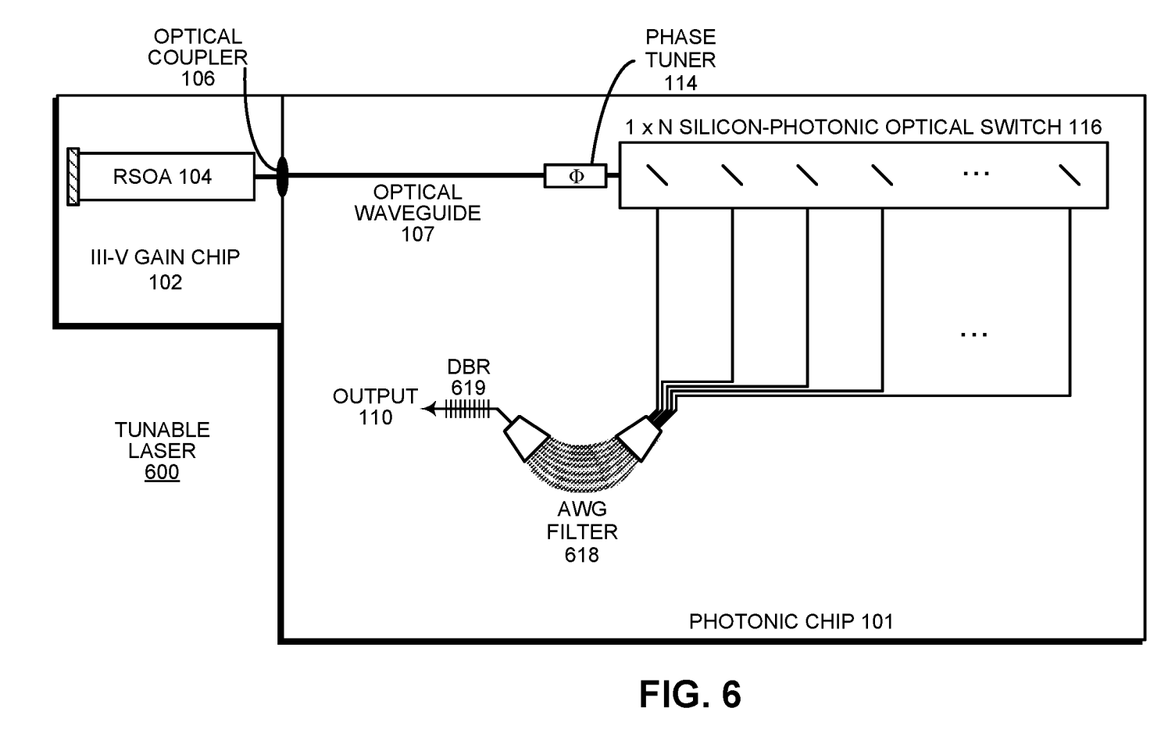
FIG. 6 illustrates a tunable laser implemented using an AWG-based wavelength filter in accordance with the disclosed embodiments.

Due to manufacturing tolerances, the channel spacing of the array of narrow-band reflectors 118 may not be as uniform as designed when individual wavelength filters are used. Wavelength tuning is typically needed for those filters to achieve the desired lasing wavelength. On the other hand, Echelle grating or arrayed waveguide grating (AWG), can provide an array of wavelength filters with accurate channel spacing. For example, FIG. 5 illustrates a tunable laser 500 that uses an Echelle grating 518 as a wavelength filter. For this configuration, a waveguide DBR 519 is used at the multiplexed output of Echelle grating 518 to provide partial reflections to the laser cavity and a laser output 110 simultaneously. Similarly, FIG. 6 illustrates a tunable laser 600 that uses an AWG filter 618 as a wavelength filter, and also uses waveguide DBR 619 at the multiplexed output of AWG filter 618 to provide partial reflections to the lasing cavity and a laser output 110 simultaneously.

Operation of the Tunable Laser

Figure 7:
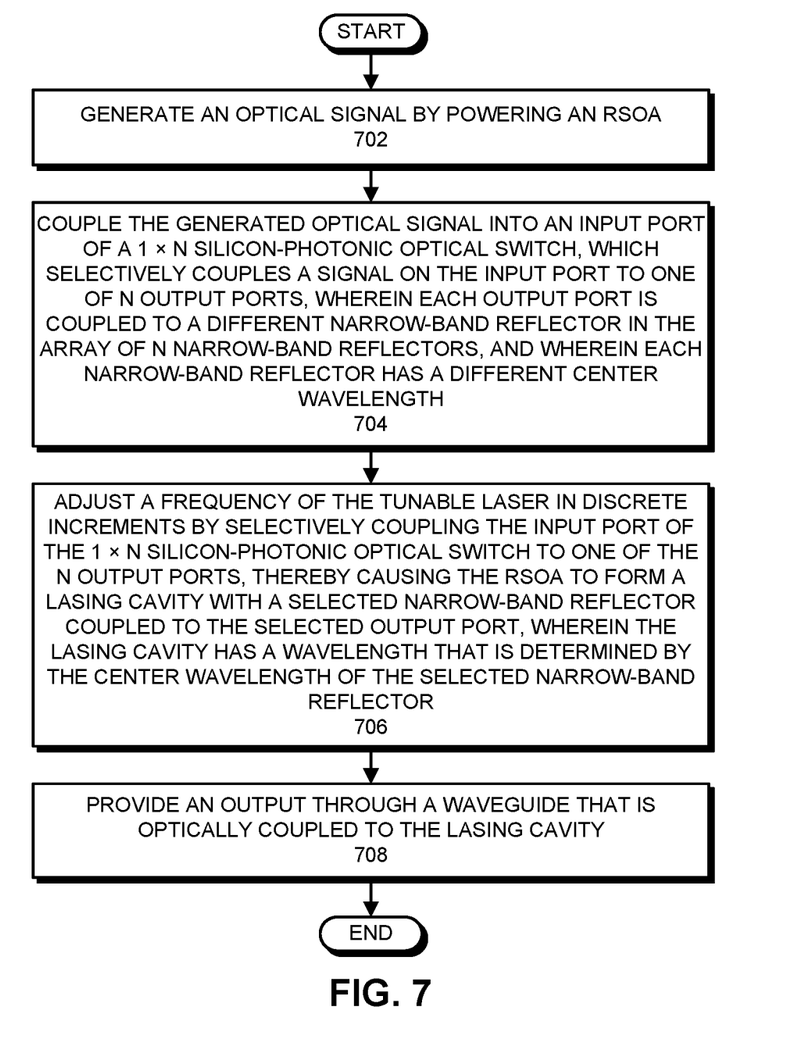
FIG. 7 presents a flow chart illustrating how a tunable laser operates in accordance with an embodiment of the present disclosure.

FIG. 7 presents a flow chart illustrating how a system that comprises a tunable laser operates in accordance with an embodiment of the present disclosure. First, the system generates an optical signal by powering an RSOA (step 702). Next, the system couples the generated optical signal into an input port of a 1×N silicon-photonic optical switch, which selectively couples the signal to one of N output ports, wherein each output port is coupled to a different narrow-band reflector in the array of N narrow-band reflectors, and wherein each narrow-band reflector has a different center wavelength (step 704). The system then adjusts a frequency of the tunable laser in discrete increments by selectively coupling the input port of the 1×N silicon-photonic optical switch to one of the N output ports, thereby causing the RSOA to form a lasing cavity with a selected narrow-band reflector coupled to the selected output port, wherein the lasing cavity has a wavelength that is determined by the center wavelength of the selected narrow-band reflector (step 706). Finally, the system provides an output through a waveguide that is optically coupled to the lasing cavity (step 708).

System

Figure 8:
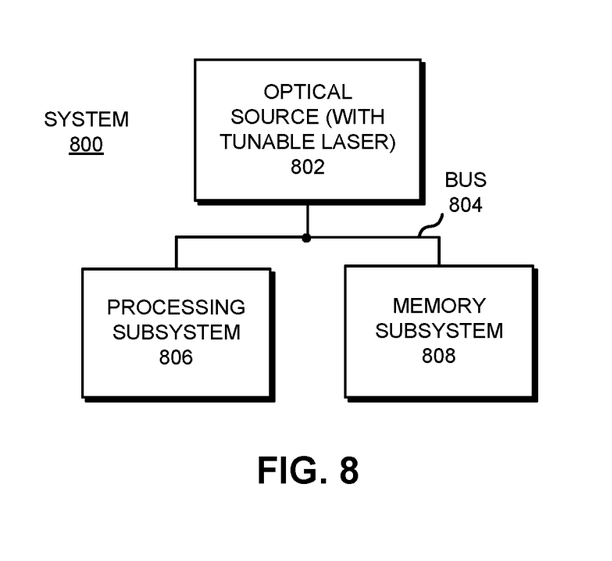
FIG. 8 illustrates a system that includes an optical source, such as a tunable laser, in accordance with an embodiment of the present disclosure.

One or more of the preceding embodiments of the tunable laser may be included in a system or device. More specifically, FIG. 8 illustrates a system 800 that includes an optical source 802 implemented using a tunable laser. System 800 also includes a processing subsystem 806 (with one or more processors) and a memory subsystem 808 (with memory).

In general, components within optical source 802 and system 800 may be implemented using a combination of hardware and/or software. Thus, system 800 may include one or more program modules or sets of instructions stored in a memory subsystem 808 (such as DRAM or another type of volatile or non-volatile computer-readable memory), which, during operation, may be executed by processing subsystem 806. Furthermore, instructions in the various modules in memory subsystem 808 may be implemented in: a high-level procedural language, an object-oriented programming language, and/or in an assembly or machine language. Note that the programming language may be compiled or interpreted, e.g., configurable or configured, to be executed by the processing subsystem.

Components in system 800 may be coupled by signal lines, links or buses, for example bus 804. These connections may include electrical, optical, or electro-optical communication of signals and/or data. Furthermore, in the preceding embodiments, some components are shown directly connected to one another, while others are shown connected via intermediate components. In each instance, the method of interconnection, or "coupling," establishes some desired communication between two or more circuit nodes, or terminals. Such coupling may often be accomplished using a number of photonic or circuit configurations, as will be understood by those of skill in the art; for example, photonic coupling, AC coupling and/or DC coupling may be used.

In some embodiments, functionality in these circuits, components and devices may be implemented in one or more: application-specific integrated circuits (ASICs), field-programmable gate arrays (FPGAs), and/or one or more digital signal processors (DSPs). Furthermore, functionality in the preceding embodiments may be implemented more in hardware and less in software, or less in hardware and more in software, as is known in the art. In general, system 800 may be at one location or may be distributed over multiple, geographically dispersed locations.

System 800 may include: a switch, a hub, a bridge, a router, a communication system (such as a wavelength-division-multiplexing communication system), a storage area network, a data center, a network (such as a local area network), and/or a computer system (such as a multiple-core processor computer system). Furthermore, the computer system may include, but is not limited to: a server (such as a multi-socket, multi-rack server), a laptop computer, a communication device or system, a personal computer, a work station, a mainframe computer, a blade, an enterprise computer, a data center, a tablet computer, a supercomputer, a network-attached-storage (NAS) system, a storage-area-network (SAN) system, a media player (such as an MP3 player), an appliance, a subnotebook/netbook, a tablet computer, a smartphone, a cellular telephone, a network appliance, a set-top box, a personal digital assistant (PDA), a toy, a controller, a digital signal processor, a game console, a device controller, a computational engine within an appliance, a consumer-electronic device, a portable computing device or a portable electronic device, a personal organizer, and/or another electronic device.

Moreover, optical source 802 can be used in a wide variety of applications, such as: communications (for example, in a transceiver, an optical interconnect or an optical link, such as for intra-chip or inter-chip communication), a radio-frequency filter, a bio-sensor, data storage (such as an optical-storage device or system), medicine (such as a diagnostic technique or surgery), a barcode scanner, metrology (such as precision measurements of distance), manufacturing (cutting or welding), a lithographic process, data storage (such as an optical-storage device or system) and/or entertainment (a laser light show).

The foregoing descriptions of embodiments have been presented for purposes of illustration and description only. They are not intended to be exhaustive or to limit the present description to the forms disclosed. Accordingly, many modifications and variations will be apparent to practitioners skilled in the art. Additionally, the above disclosure is not intended to limit the present description. The scope of the present description is defined by the appended claims.

What is claimed is:

1. A tunable laser, comprising:
   a reflective silicon optical amplifier (RSOA) having a reflective end and an interface end;
   an array of N narrow-band reflectors, wherein each narrow-band reflector has a different center wavelength;
   a 1×N silicon-photonic optical switch, having an input port and N output ports, wherein each output port is coupled to a different narrow-band reflector in the array of N narrow-band reflectors;
   an optical waveguide coupled between the interface end of the RSOA and the input of the 1×N silicon-photonic optical switch;
   an adjustment mechanism that facilitates adjusting a frequency of the tunable laser in discrete increments by selectively coupling the input port of the 1×N silicon-photonic optical switch to one of the N output ports, thereby causing the RSOA to form a lasing cavity with a selected narrow-band reflector coupled to the selected output port, wherein the lasing cavity has a wavelength that is determined by the center wavelength of the selected narrow-band reflector; and
   a laser output optically coupled to the lasing cavity.

2. The tunable laser of claim 1, wherein there exists a predetermined channel spacing between center wavelengths for the N narrow-band reflectors in the array of N narrow-band reflectors.

3. The tunable laser of claim 1, wherein the RSOA is located on a M-V gain chip, which is separate from a silicon-on-insulator (SOI) chip that includes the optical waveguide and other components of the tunable laser.

4. The tunable laser of claim 1, wherein the optical waveguide feeds through a phase tuner before coupling to the input of the 1×N silicon-photonic optical switch, wherein the phase tuner facilitates adjusting a frequency of the integrated laser.

5. The tunable laser of claim 1, wherein the lasing cavity includes a passive thermo-optic coefficient (TOC) compensator comprised of compensation material, which has a thermo-optic index coefficient smaller than silicon and a length selected to make an effective thermo-optic index coefficient for the length of compensation material in combination with a length of gain material in the lasing cavity equivalent to the thermo-optic index coefficient of silicon.

6. The tunable laser of claim 1, wherein the laser output comprises a directional coupler integrated into the optical waveguide.

7. The tunable laser of claim 1, wherein each narrow-band reflector in the array of N narrow-band reflectors comprises a distributed Bragg reflector (DBR), wherein each DBR in the array has a different pitch to achieve a different center wavelength.

8. The tunable laser of claim 1, wherein each narrow-band reflector in the array of N narrow-band reflectors comprises a ring-resonator-based filter, wherein each ring-resonator-based filter in the array has a different radius to achieve a different center wavelength.

9. The tunable laser of claim 1, wherein the array of N narrow-band reflectors is implemented using an arrayed waveguide grating (AWG), wherein a waveguide DBR is coupled to a multiplexed output of the AWG to provide partial reflections to the lasing cavity and also to simultaneously provide the laser output.

10. The tunable laser of claim 1, wherein the array of N narrow-band reflectors is implemented using an Echelle grating, wherein a waveguide DBR is coupled to a multiplexed output of the Echelle grating to provide partial reflections to the lasing cavity and also to simultaneously provide the laser output.

11. A system, comprising:
   at least one processor;
   at least one memory coupled to the at least one processor; and a tunable laser for communicating optical signals generated by the system, wherein the tunable laser includes:
- a reflective silicon optical amplifier (RSOA) having a reflective end and an interface end;
- an array of N narrow-band reflectors, wherein each narrow-band reflector has a different center wavelength;
- a 1×N silicon-photonic optical switch, having an input port and N output ports, wherein each output port is coupled to a different narrow-band reflector in the array of N narrow-band reflectors;
- an optical waveguide coupled between the interface end of the RSOA and the input of the 1×N silicon-photonic optical switch;
- an adjustment mechanism that facilitates adjusting a frequency of the tunable laser in discrete increments by selectively coupling the input port of the 1×N silicon-photonic optical switch to one of the N output ports, thereby causing the RSOA to form a lasing cavity with a selected narrow-band reflector coupled to the selected output port, wherein the lasing cavity has a wavelength that is determined by the center wavelength of the selected narrow-band reflector; and
- a laser output optically coupled to the lasing cavity.

12. The system of claim 11, wherein the RSOA is located on a M-V gain chip, which is separate from a silicon-on-insulator (SOI) chip that includes the optical waveguide and other components of the tunable laser.

13. The system of claim 11, wherein the optical waveguide feeds through a phase tuner before coupling to the input of the 1×N silicon-photonic optical switch, wherein the phase tuner facilitates adjusting a frequency of the integrated laser.

14. The system of claim 11, wherein the lasing cavity includes a passive thermo-optic coefficient (TOC) compensator comprised of compensation material, which has a thermo-optic index coefficient smaller than silicon and a length selected to make an effective thermo-optic index coefficient for the length of compensation material in combination with a length of gain material in the lasing cavity equivalent to the thermo-optic index coefficient of silicon.

15. The system of claim 11, wherein the laser output comprises a directional coupler integrated into the optical waveguide.

16. The system of claim 11, wherein each narrow-band reflector in the array of N narrow-band reflectors comprises a distributed Bragg reflector (DBR), wherein each DBR in the array has a different pitch to achieve a different center wavelength.

17. The system of claim 11, wherein each narrow-band reflector in the array of N narrow-band reflectors comprises a ring-resonator-based filter, wherein each ring-resonator-based filter in the array has a different radius to achieve a different center wavelength.

18. The system of claim 11, wherein the array of N narrow-band reflectors is implemented using an arrayed waveguide grating (AWG), wherein a waveguide DBR is coupled to a multiplexed output of the AWG to provide partial reflections to the lasing cavity and also to simultaneously provide the laser output.

19. The system of claim 11, wherein the array of N narrow-band reflectors is implemented using an Echelle grating, wherein a waveguide DBR is coupled to a multiplexed output of the Echelle grating to provide partial reflections to the lasing cavity and also to simultaneously provide the laser output.

20. A method for operating a tunable laser, comprising:
- generating an optical signal by powering a reflective silicon optical amplifier (RSOA);
- coupling the generated optical signal into an input port of a 1×N silicon-photonic optical switch, which selectively couples a signal on the input port to one of N output ports, wherein each output port is coupled to a different narrow-band reflector in the array of N narrow-band reflectors, and wherein each narrow-band reflector has a different center wavelength;
- activating an adjustment mechanism that facilitates adjusting a frequency of the tunable laser in discrete increments by selectively coupling the input port of the 1×N silicon-photonic optical switch to one of the N output ports, thereby causing the RSOA to form a lasing cavity with a selected narrow-band reflector coupled to the selected output port, wherein the lasing cavity has a wavelength that is determined by the center wavelength of the selected narrow-band reflector; and
- providing an output through a waveguide that is optically coupled to the lasing cavity.

* * * * *

UNITED STATES PATENT AND TRADEMARK OFFICE
CERTIFICATE OF CORRECTION

| | |
|---|---|
| PATENT NO. | : 9,780,524 B1 |
| APPLICATION NO. | : 15/341675 |
| DATED | : October 3, 2017 |
| INVENTOR(S) | : Xuezhe Zheng et al. |

Page 1 of 1

It is certified that error appears in the above-identified patent and that said Letters Patent is hereby corrected as shown below:

In the Specification (Column 1, Line 44), please delete, "(BOEL)", and replace with --(BEOL)--

In the Claims (Column 8, Claim 3, Line 23), please delete, "M-V", and replace with --III-V--

(Column 9, Claim 12, Line 26), please delete, "M-V", and replace with --III-V--

Signed and Sealed this
Twenty-seventh Day of November, 2018

Andrei Iancu
*Director of the United States Patent and Trademark Office*